United States Patent [19]

Ieki et al.

[11] 4,037,181
[45] July 19, 1977

[54] ACOUSTIC SURFACE WAVE FILTER DEVICES

[75] Inventors: Hideharu Ieki; Hideki Ishiyama; Atushi Inoue, all of Nagaokakyo, Japan

[73] Assignee: Murata Manufacturing Co., Ltd., Nagaokakyo, Japan

[21] Appl. No.: 666,303

[22] Filed: Mar. 12, 1976

[30] Foreign Application Priority Data

Mar. 12, 1975 Japan .................................. 50-30300
June 11, 1975 Japan ............................ 50-79944[U]
Dec. 9, 1975 Japan .......................... 50-168768[U]
Dec. 12, 1975 Japan ................................ 50-148638
Dec. 27, 1975 Japan ................................ 50-158969

[51] Int. Cl.² ...................... H03H 9/02; H03H 9/26; H03H 9/32; H01L 41/04
[52] U.S. Cl. ..................................... 333/72; 310/9.8; 333/30 R
[58] Field of Search .................. 333/72, 30 R; 310/8, 310/8.1, 8.2, 9.8

[56] References Cited

U.S. PATENT DOCUMENTS

| 3,548,306 | 12/1970 | Whitehouse | 333/30 X |
| 3,582,540 | 6/1971 | Adler et al. | 333/72 X |
| 3,582,838 | 6/1971 | De Vries | 333/72 |
| 3,663,899 | 5/1972 | Dieulesaint et al. | 333/72 X |
| 3,676,724 | 7/1972 | Berlincourt et al. | 310/8.2 |
| 3,723,915 | 3/1973 | Adler et al. | 333/30 R |
| 3,855,556 | 12/1974 | Hartmann | 333/72 |
| 3,882,433 | 5/1975 | Subramanian | 333/72 |

OTHER PUBLICATIONS

Hartemann et al., "Acoustic-Surface-Wave Filters" in Electronic Letters, Dec. 11, 1969; pp. 657-658.

Primary Examiner—Alfred E. Smith
Assistant Examiner—Marvin Nussbaum
Attorney, Agent, or Firm—Birch, Stewart, Kolasch & Birch

[57] ABSTRACT

An acoustic surface wave filter device for use in video IF stages in television receivers and the like, which comprises a substrate of a piezoelectric material and a spaced pair of transducers each of which is composed of a pair of interleaved comb type electrodes. One of the transducers is designed so as to have a frequency response curve in which attenuation poles at the both sides of the main lobe thereof, respectively, occur at frequencies corresponding to the upper adjacent-channel picture carrier frequency and the lower adjacent-channel sound carrier frequency. The other of the transducers is designed so as to have a frequency response curve in which the bandwidth thereof corresponds to the width from the sound carrier frequency of the associated channel to the lower adjacent-channel sound frequency. The substrate may be provided with a piezoelectric resonator. The substrate may be further provided with at least one ancillary transducing element. The acoustic surface wave filter device exhibits the desired overall response curve required for the video IF stages in television receivers and the like.

5 Claims, 16 Drawing Figures

ACOUSTIC SURFACE WAVE FILTER DEVICES

This invention relates to acoustic surface wave filter devices. More particularly, it relates to acoustic surface wave filter devices suitable for use in video IF stages in television receivers and the like.

There has been known an acoustic surface filter comprising a spaced pair of transducers each comprising a pair of interleaved-comb-type electrodes on a substrate. Such transducers have a frequency response curve that exhibits a main lobe of maximum response at a center frequency with smaller lobes at successive lower and higher frequencies. However, it is impossible with such conventional filters to provide the described overall reponse curve required for video IF stages in color television receivers and the like since such filters show insufficient attenuation both in the sound IF carrier frequency and in side lobe frequencies.

It is therefore an object of the present invention to provide a new and improved acoustic surface wave filter device which exhibits the desired IF response curve required for the video IF stages in television receivers and the like.

Another object of the present invention is to provide an acoustic surface wave filter device which makes it unnecessary to adjust the frequency response characteristics of the video IF stages.

According to the present invention, there is provided an acoustic surface wave filter device comprising a substrate of a piezoelectric material and a spaced pair of input and output transducers formed on said substrate, one of said transducers comprising a pair of interleaved comb type electrodes with constant length and uniform spacing and having a frequency response curve wherein attenuation poles at both sides of the main lobe thereof, respectively, occur at a frequency corresponding to the upper adjacent-channel picture IF carrier frequency and at a frequency corresponding to the lower adjacent-channel sound IF carrier frequency, the other transducer comprising a pair of interleaved comb type electrodes and having a frequency response curve wherein the passband width thereof corresponds to the width from the sound IF carrier frequency of the associated channel to the lower adjacent-channel sound IF carrier frequency.

Preferably said filter device is provided with a piezoelectric resonator which has a resonance or anti-resonance frequency corresponding to the sound IF carrier frequency of the associated-channel.

Preferably said filter device is further provided with at least one ancillary acoustic surface wave transducing element formed on the substrate, said element functioning as a delay line or a resonator.

The piezoelectric substrate material may comprise a thin layer of ZnO formed on a glass base, or a piezoelectric material such as piezoelectric ceramics, quartz, LiNbO$_3$, etc.

These and other features and objects of the present invention will be further apparent from the following description with reference to the figures of the accompanying drawings, which show by way of example only, a number of forms of the acoustic surface wave filter device embodying the invention, in which.

Figure 1:
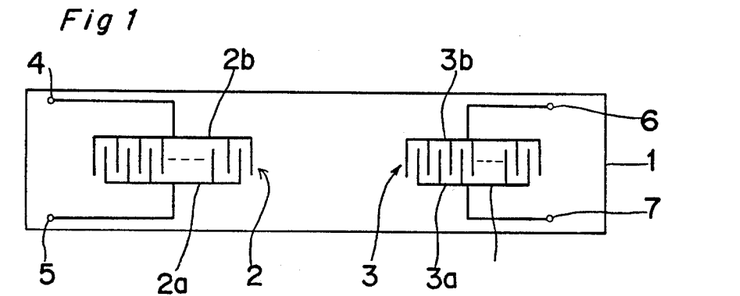
FIG. 1 is a schematic digaram of one embodiment of an acoustic surface wave filter device according to the present invention.

Referring now to FIG. 1, an acoustic surface wave filter device comprises a substrate 1 of a piezoelectric material and a spaced pair of input and output transducers 2 and 3 formed on said substrate. Each of the transducers 2 and 3 comprises interdigital electrodes with constant length and uniform spacing, i.e., a pair of interleaved comb type electrodes 2a and 2b, or 3a and 3b comprising a plurality of electrode elements with a constant length and uniform spacing. One of the transducers, e.g., the input transducer 2, is designed so as to have a frequency response curve wherein the attenuation pole C between the main lobe A and the lower side lobe B occurs at a frequency between the upper adjacent-channel picture IF carrier frequency $f_p'$ and the sound IF carrier frequency $f_s$ of the associated channel, and wherein an attenuation pole E between the main lobe A and the higher side lobe D occurs at a frequency higher than the lower adjacent-channel sound IF carrier frequency $f_s'$ (cf. FIG. 3). Thus, the input transducer has passband width of from the sound IF carrier frequency $f_s$ to the lower adjacent-channel sound IF carrier frequency $f_s'$. This may be achieved by suitably determined variables such as the size, shape and pitch between the centers of two consecutive electrode elements in each electrode in the transducer.

Figure 4:
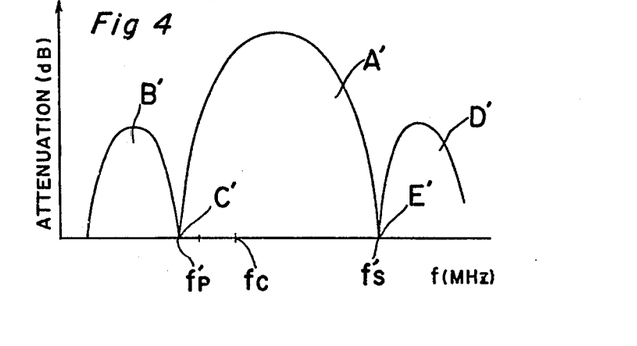

The other transducer, e.g., the output transducer 3, is designed so as to have a response curve wherein the attenuation pole C' between the main lobe A' and the lower side lobe B' occurs at a frequency corresponding to the upper adjacent-channel picture IF carrier frequency $f_p'$ and wherein an attenuation pole E' between the main lobe A' thereof and the higher side lobe D' occurs at a frequency corresponding to the lower adjacent-channel picture IF carrier frequency $f_s'$ (cf. FIG. 4).

Figure 3:
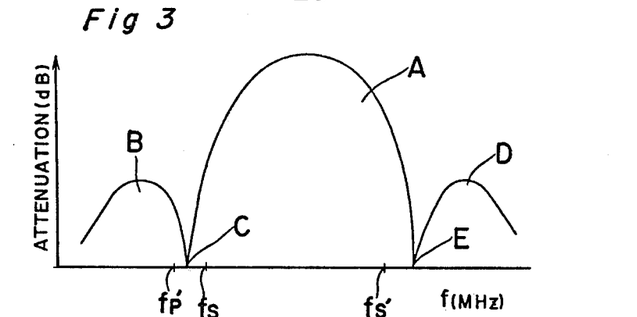
FIGS. 3 – 5 are graphs showing frequency response curves of the filter device of FIG. 1.
Figure 5:
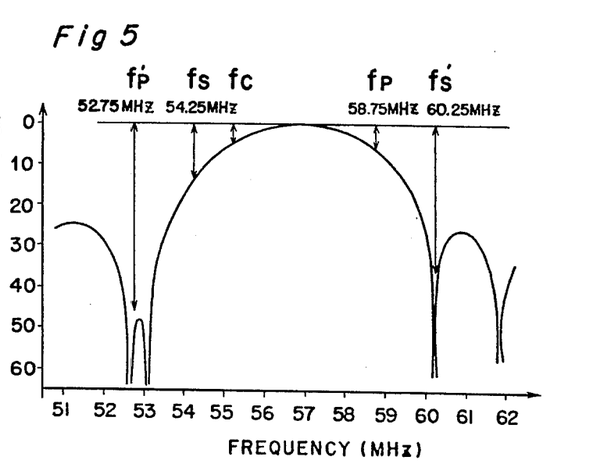

In FIGS. 3 – 5, $f_p'$ is the upper adjacent-channel picture IF carrier frequency, $f_s'$ is the lower adjacent-channel sound IF carrier frequency, $f_p$ is the picture IF carrier frequency of the associated channel, $f_s$ is the sound IF carrier frequency of the selected channel, and $f_c$ is the chroma carrier frequency of the associated channel.

The location of carrier frequencies for associated sound and picture, lower adjacent-channel sound, and upper adjacent-channel picture, on IF response curve varies from country to country, so that the invention will now be explained with the standard values specified by the Japanese standard system for television to illustrate an operative example.

Under the Japanese standard system, these carrier frequencies are specified as follows:

$f_p' = 52.75$ MHz
$f_c = 55.17$ MHz
$f_s = 54.25$ MHz
$f_p = 58.75$ MHz
$f_s' = 60.25$ MHz

Figure 2:
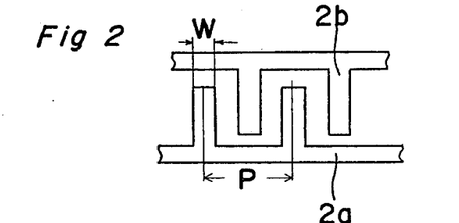
FIG. 2 is an enlarged detail view of the electrodes of the embodiment of FIG. 1.

In the above embodiment, the input transducer comprises a pair of interleaved normal-comb-type electrodes having the width (W) of electrode element of 10.55 μm and the pitch (P) of 42.20 μm corresponding to the acoustic wavelength of a signal for which it is desired to achieve maximum response in the transducer, and the numbers of pairs of electrode elements in said transducer is formed into 13.5 pairs (cf. FIG. 2). The output transducer transducer comprises a pair of interleaved normal-comb-type electrodes having the width of electrode element of 10.75 μm and the pitch of 43.00 μm corresponding to the acoustic wavelength of a signal for which it is desired to achieve maximum response in that transducer, and the number of pairs of electrode elements therein is formed into 15.5 pairs. As will be seen from the above, the electrode elements with constant length in each electrode are designed so as to have a width corresponding to a quarter of the acousitc wavelength for which it is desired to achieve maximum response in each transducer.

By the arrangement as described above, it is possible to make the pole C of the input transducer occur at a frequency between $f_p'$ and $f_2$, and the pole E at a frequency higher than $f_s'$. It is also possible to make pole C' of the output transducer occur at a frequency corresponding to $f_p'$, and the pole E' at a frequency corresponding to $f_s'$. FIG. 5 shows the overall response curve of the acoustic surface wave filter device of this embodiment which substantially agrees with the desired IF response curve required for the video IF stages.

Figure 6:
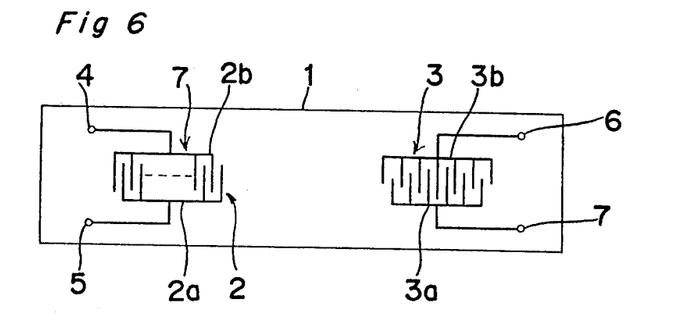
FIG. 6 is a schematic diagram of another embodiment of an acoustic surface wave filter device according to the present invention.
Figure 7:
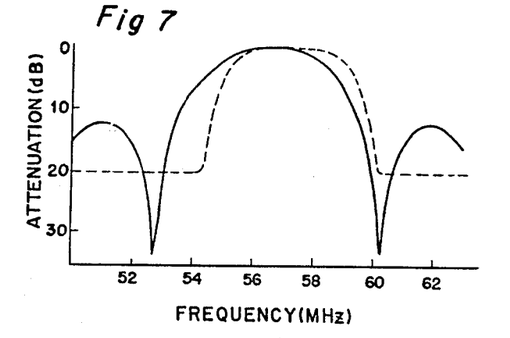
FIG. 7 and 8 are graphs showing response curves of the filter device of FIG. 6.

In the embodiment shown in FIG. 6, the input transducer 2 is composed of a pair of interleaved-normal-comb-type electrodes 2a and 2b, while the output transducer 3 is composed of a pair of lengthweighted interleaved-comb-type electrodes 3a and 3b consisting essentially of alternating varied-length electrode elements. The input transducer 2 shows the response curve illustrated by the solid line in FIG. 7, which corresponds to the response curve of the output transducer in the embodiment of FIG. 1. The output transducer shows the response curve illustrated by the dotted line in FIG. 7, from which it will be seen that it shows flat response at the frequencies of the center and vicinity of the passband with its lower and higher limits at the sound carrier frequency of 54.25 MHz and at the lower adjacent-channel sound carrier frequency of 60.25 MHz respectively, and has great side lobe attenuation.

Figure 8:
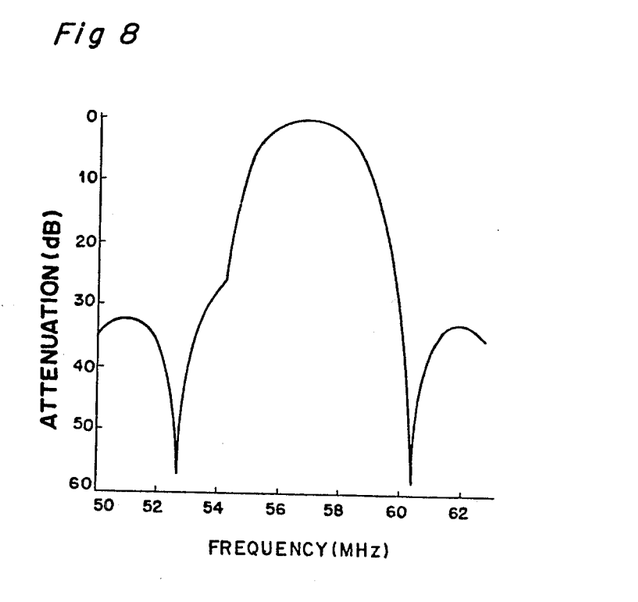

The overall response curve of this embodiment is shown in FIG. 8 which substantially agrees with the desired IF response curve required for the video IF stages.

In the foregoing embodiments of FIGS. 1 and 6, the acoustic surface wave filter device comprises a spaced pair of transducers formed on the same plane of the substrate, and has a frequency response curve which substantially corresponds to the desired IF response curve needed in video IF stages. However, many difficulties arise in the manufacture of such acoustic surface wave filter devices. For example, these devices may exhibit a response curve in which 20 dB attenuation takes place at a frequency corresponding to the sound carrier frequency, since the frequency characteristic of the filter device is sensitive to the shape and pitch of the electrode.

It has now been found that these dificulties can be overcome by the provision of a piezoelectric resonator having such a frequency characteristic as to have a resonance frequency or anti-resonance frequency corresponding to the sound carrier frequency in the video IF stages.

Figure 9:
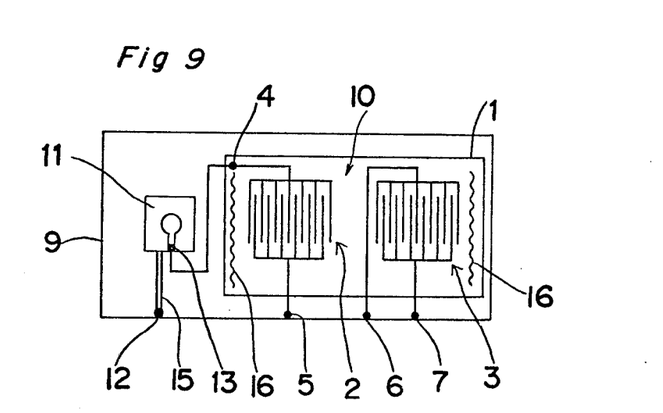
FIG. 9 is schematic diagram showing still another embodiment of the filter device according to the present invention.

Referring now to FIG. 9, an acoustic surface wave filter device according to the present invention comprises a support 9 having an acoustic surface wave filter unit 10 and a piezoelectric resonator 11 both mounted on one of the opposed surfaces thereof. The filter unit 10 is of a construction including a substrate 1 having one of the opposed surfaces thereof regidly mounted on the support 9, the other of said opposed surfaces thereof formed with spaced input and output transducers 2 and 3. As so far illustrated, each of the input and output transducers 2 and 3 is constituted by a pair of interleaved-comb-type electrodes 2a and 2b, or 3a and 3b in like manner as described above with respect to FIG. 1. While the support 9 has a plurality of connecting terminals 5, 6, 7 and 12 for external electric connections, which connecting terminals 5, 6, 7 and 12 are regidly secured to, for example, a peripheral edge of the support 9. The interleaved electrodes 2a of the input transducer 2 and the interleaved electrodes 3a and 3b of the output transducer 3 are respectively connected to the connecting terminals 5, 6 and 7. The other of the interleaved electrodes 2b of the input transducer 2 are coupled to the resonator 11 in such a manner as will subsequently be described.

The resonator 11 is positioned on the support 9 in the vicinity of the filter unit 10 and is of a construction including a resonance element having its opposed end faces rigidly mounted with a pair of electrodes, only one of which electrodes is shown by 13 in FIG. 9. While the electrode 13 is coupled to said other of the interleaved electrodes 2b of the input transducer 2 through a conductive element 14, the other electrode opposed to the electrode 13 is coupled to the connecting terminal 12 through a conductive element 15.

The substrate 1 has a pair of spaced dampers 16, made of vibration-damping material such as silicone rubber, one of said dampers being positioned between the resonator 11 and the input transducer 2 while the other of said dampers 16 is positioned between the output transducer 3 and one of the opposed ends of the substrate 1 remote from the resonator 11.

Figure 10:
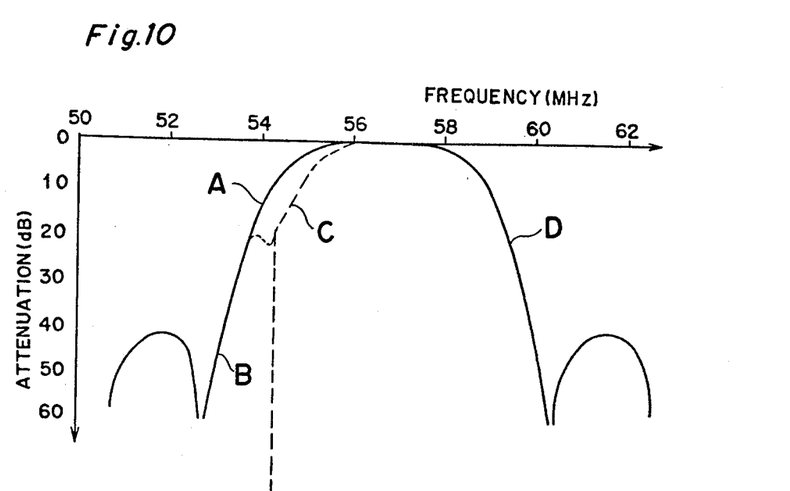
FIG. 10 is a graph showing a frequency response curve to the filter device of FIG. 9.
Figure 11:
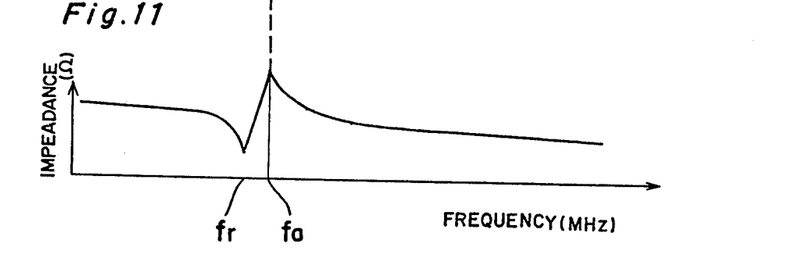
FIG. 11 is a graph showing a frequency characteristic of a piezoelectric resonator used in the embodiment of FIG. 9.

It is to be noted that the acoustic surface wave filter unit 10 is designed so as to have a frequency characteristic such that no substantial attenuation takes place even at the sound carrier frequency as shown by the solid line A in FIG. 10, with a bandwith satisfying a predetermined local standard. On the other hand, the resonator 11 is designed so as to have such a frequency characteristic as to have a resonance frequency or anti-resonance frequency at the sound carrier frequency $f_s$ in the video IF stages as shown in FIG. 11.

However, in the construction described above, it is clear that the filter unit 10 and the resonator 11 are electrically connected in series with each other, such that the anti-resonance frequency of the resonator 11 stands substantially equal to the sound carrier frequency in the video IF stages.

Since the acoustic surface wave filter device according to the embodiment shown in FIG. 9 is constructed in the manner as hereinbefore described, the composite frequency band resulting from the combined filter unit 10 and the resonator 11 has a predetermined bandwidth, exhibiting such a frequency characteristic that, as shown by the solid line B, the broken line C and the solid line D in FIG. 10, more than 20dB attenuation can be achieved at the sound carrier frequency.

In the foregoing embodiment of FIG. 9, the resonator 11 has been described as independent of the substrate 1 of the filter unit 10. However, a portion of the substrate 1 can be utilized as a piezoelectric element for the resonator, which will now be described with particular reference to FIG. 12.

Figure 12:
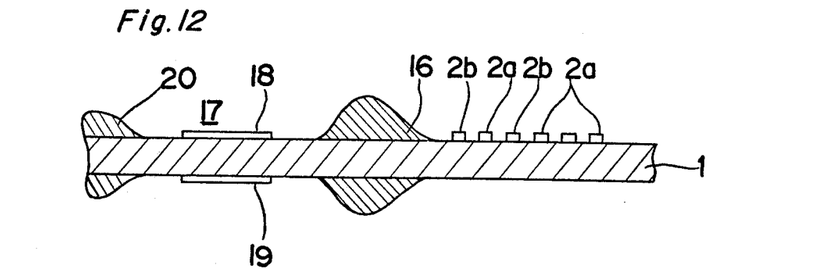
FIG. 12 is a partial sectional view of a related embodiment of the filter device of the present invention.

The resonator in the embodiment of FIG. 12 is indicated by 17 and is formed merely by connecting electrodes 18 and 19 to the opposed surface of the substrate 1 in alignment with each other. The electrode 18 functionally corresponds to the electrode 13 of the foregoing embodiment of FIG. 9 and, therefore, is connected to the interleaved electrode 2b of the input transducer 2, while the other electrode 19 is coupled to the connecting terminal 12. In addition, applied to the other of the opposed surfaces of the substrate 1 in alignment with the respective dampers 16 are additional dampers functioning in a substantially similar manner as the damper 16 shown in FIG. 9.

An additional pair of dampers 20 are also applied to the opposed surfaces of the substrate 1 with the electrodes 18 and 19 situated between said dampers 20 and the dampers 16.

In the construction shown in FIG. 12, the thickness of the substrate 1 is necessarily some multiplication of the wavelength of the acoustic surface wave. On the other hand, in view of the fact that, as resonance of the resonator 17 becomes a high order, variation in impedance therof becomes small, and therefore, the fifth or seventh overtone of the resonator 17 is preferably selected to be at the sound carrier frequency, that is, about 54.25 MHz, in the video IF stages.

Taking advantage of this impedance variation at the high order resonance, the attenuation characteristic such as shown by the broken line C in FIG. 10 can be obtained. In other words, the anti-resonance frequency can be set to about 54.25 MHz.

It is to be noted that an amplifier (not shown) may be interposed between the resonator 17 and the filter unit 10. Moreover, the anti-resonance frequency (54.25 MHz) of the resonator can be adjusted by varying the thickness of the substrate 1. Fine adjustment of the resonator 17 can also be achieved merely by adding an additional mass to the electrodes. Furthermore, although the amount of attenuation at 54.25 MHz can be determined depending upon a retio of the impedance of the resonator 17 relative to that of the acoustic surface wave filter unit 10, it can also be adjusted by varying the surface area of one or both of the electrodes 18 and 19 of the resonator 17.

Where the substrate 1 is made of PZT which is likely to result in variation of the velocity of propagation of the acoutic surface wave, such variation is relatively small so far as the filter unit 10 and the resonator 17 are both mounted on a single, common substrate such as shown in FIG. 12. Therefore, the surface wave filter device itself exhibits such a frequency characteristic as substantially shown in FIG. 10 even through the frequency characteristic of the filter unit 10 and that of the resonator 17 undergo variation without destroying the frequency relationship between them.

Figure 13:
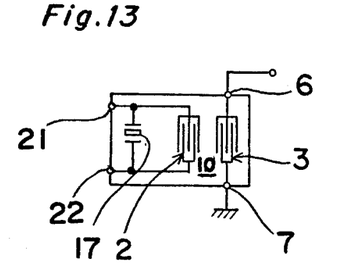
FIGS. 13 to 16 inclusive show four shematic diagrams of further embodiments of the filter deivce according to the present invention.

In the foregoing embodiments of FIGS. 9 and 12, the filter unit 10 and the resonator 11 or 17 have been described as being in series connection. However, the resonator may be connected in parallel with the one of the input and output transducers 2 and 3, for example, as shown in FIG. 13. Where the filter unit 10 and the resonator 11 or 17 are electrically connected in parallel with each other, the resonator is designed so as to have a resonance frequency corresponding to the sound carrier frequency in video IF stages.

Figure 14:
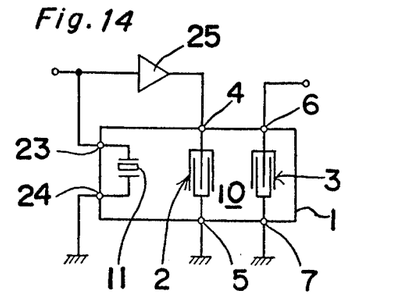

It is to be noted that the electrodes of the resonator 11 or 17 may be separately coupled to connecting terminals 23 and 24 for external electric connections, which terminals are provided on the surface of substrate 1 or support 9, as shown in FIG. 14 in which the resonator is connected to the filter unit in parallel via an amplifier 25. In the embodiments of FIG. 14, various connection may be applicable. For example, the resonator 17 and the input transducers may be connected in series by connecting the terminals 23 of the resonator 17 with the terminal 4 of the input transducer 2.

It is also to be noted that the acoustic surface wave filter devices in foregoing embodiments of FIGS. 1, 6, 9 and 12 may be operated in the reverse of their electrical function described above. In other words, the input transducer 2 may be used as an output transducer, while the output transducer 3 may be used as an onput transducer. Furthermore, the piezoelectric resonator 11 or 17 may be connected in parallel or in series to the output transducer.

During the manufacture of the acoustic surface wave filter device, the interleaved-comb-type electrodes of the input and output transducers can precisely be formed on the substrate by any known precise depositing method, such as by means of a photo-etching technique, in a predetermined pattern. Accordingly, it can be said that there is no substantial possibility that variation of the frequency characteristics of the acoustic surface wave filters attributes to the dimensional relationship of the input and output transducers on the substrate. However, where the substrate is made of a ceramic material, the velocity of propagation of the acoustic surface wave through the substrate tends to vary with every substrate. On the other hand, where the substrate is made of a syngle crystal such a material as $LiNbO_3$, variation in thickness of some or all of the interleaved-comb-type electrodes of the input and output transducer is likely to result in variation of the velocity of propagation of the acoustic surface wave through the substrate even though variation of the propagation velocity attributable to the type of material for the substrate is small.

In any event, if the velocity of propagation of the elastic surface wave departs from a predetermined value in the manner as hereinbefore described, the frequency response curve of the filter device does not vary with respect to the overall shape of the curve, but is shifted resulting in a variation of the frequencies. In other words, assuming that the frequencies $f_c$ and $f_p$ at which 6dB attenuation takes place when the propagation velocity is 3,400 m/sec. are desired to be 55.170 MHz and 58.750 MHz, respectively, thereby satisfying a desired frequency range, these frequencies $f_c$ and $f_p$ are shifted to 55.332 MHz and 58.923 MHz, respectively when the propagation velocity becomes 3,410 m/sec. (0.3% increase), thus departing from the desired frequency range. At the same time the difference between the frequencies $f_c$ and $f_p$ also varies, for example, the difference of (58.750 MHz less 55.170 MHz) which ought to be 3.58 MHz varies to 3.591 MHz which is a difference of (58.923 MHz less 55.332 MHz). However, such variation of the difference between the frequencies $f_c$ and $f_p$ can, if the propagating velocity is low, be negligible.

In the case where such an elastic surface wave filter exhibiting a characteristic wherein the frequency at which 6dB attenuation takes place departs from the desired frequency range, is incorporated into a television receiver circuitry, respective frequencies of the video carrier and chrominance signal, which are fed from the turner to the filter, must have been adjusted to the frequency 6dB attenuated of the filter, by varying the local oscillating frequency of the tuner.

Replacing the filter circuit which is substantially composed of several IFT's and two to three LC trap circuits and which has widely been employed at the time the surface wave filter has not yet been developed, with the elastic surface wave filter, substantially satisfies such requirements as to minimize the number of necessary electric components and to substantially eliminate the necessity of adjustment. However, so far as the above described adjustment is still required, the advantage resulting from the employment of the acoustic surface wave filter in place of the filter circuit which is substantially composed of several IFT's and two to three LC trap circuits will be minimized.

Figure 15:
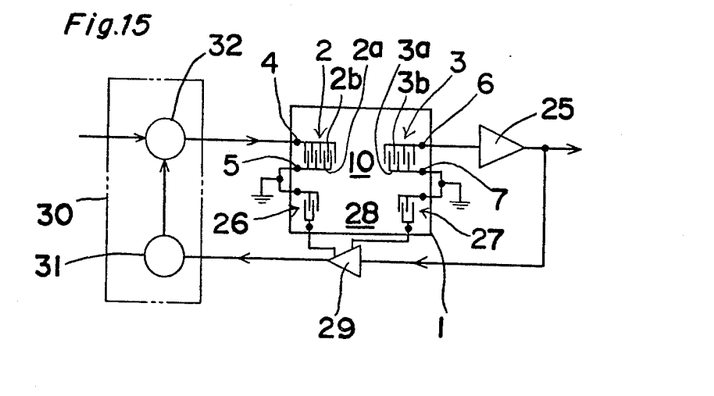

With reference to FIG. 15, an acoustic surface wave filter unit comprises a piezoelectric substrate 1 having one of its opposed surrfaces formed with input and output transducers 2 and 3 each of which transducers 2 and 3 is, as so far illustrated, composed of a pair of interleavedcomb-type electrodes 2a and 2b, or 3a and 3b.

it is to be noted that the substrate 1 may be in the form of an electrically insulating plate having one surface formed with a thin layer of piezoelectric material such as ZnO, or in the form of a plate-like body of single crystal such as LiNbO$_3$ or any other piezoelectric material.

Mounted on the same surface of the substrate 1 as the transducers 2 and 3 are a spaced pair of transducing elements composed of a pair of interleaved comb-type electrode 26 and 27 which constituted a delay line 28. These electrodes 26 and 27 are formed on the substrate 1 in a substantially similar manner to the input and output transducers 2 and 3, the pattern of the electrodes 26 and 27 being so selected that the operating center frequency of a frequency descriminator which includes this delay line 28 and a phase detector as will be described later is substantially equal to the frequency $f_p$ of the filter unit 10.

If the acoustic surface wave filter device of the construction shown in FIG. 15 is incorporated into the video IF stages, the filter device is electrically coupled therein to establish the circuitry shown in FIG. 15. It is to be noted that, in the circuitry of FIG. 15, reference numerals 29, 30, 31 and 32 respectively represent the detector, a tuner, a local oscillating circuit and a mixing circuit.

The operation of the circuitry shown in FIG. 15 will now be described.

Assuming that the velocity of the wave propagation through the substrate 1 is shifted from 3,400 m/sec. to 3,410 m/sec., the phase characteristic of the delay line varying dependent on the velocity of acoustic waves. This phase variation can be detected by the detector 29 which in turn generates an output signal indicative of the phase variation to the oscillator circuit 31 of the tuner 30. The frequency of the oscillator circuit 31 varies, when this output signal is received by said circuit 31, and consequently the frequency of an electric signal to be applied from the mixing circuit 32 to the filter unit 10, so far as the frequency of the video carrier is concerned, varies from $f_p(=58.750$ MHz) to $f_{p1}$ ($=58.923$ MHz). In other words, even if the frequency of the filter unit 10 varies according to the velocity of surface wave propagation along the substrate 1, the frequency of the signal from the tuner 30 automatically varies with the variation of the frequency of the filter unit 10. Moreover, since the filter unit 10 and the delay line 28 are formed on one and the same substrate 1 and, therefore, both of the filter unit 10 and the delay line 28 are simultaneously affected by the variation of the velocity of surface wave propagation through the substrate 1, the frequency of the signal from the tuner 30 and that of the filter unit 10 are substantially equalized to each other. In view of the foregoing, ti is clear that no frequency adjustment, which may otherwise be required due to variations of the substrates, is required. It is to be noted that, although the description has been made on the assumption that the velocity of propagation across the electrodes is equal to that across the transmission line, both velocities differ from each other in the case where no metallic electrodes similar to the electrodes is provided on the transmission line. However, where variations of the velocity of propagation through such a substrate made of ceramic material having a piezoelectric property constitutes a source of problem, the velocity of propagation across the electrodes can be considered as equally varying with variation of the velocity of propagation across the transmission line. With respect to the variation of the wave propagation occurring in the substrate made of syngle crystal such as LiNbO$_3$ resulting from variation in thickness of each of the metallic electrodes, the employment of metallic electrodes on the transmission line is recommended.

Figure 16:
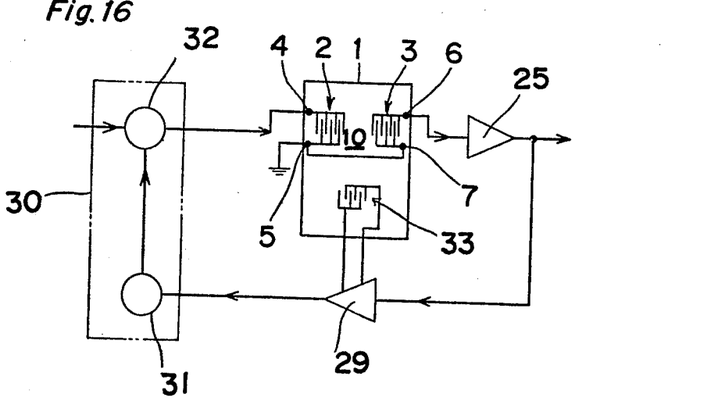

FIG. 16 shows another form of an acoustic surface wave filter device in which filter unit 10, its individual transducers 2 and 3, and its functions are the same as described above with respect to FIG. 15. In this embodiment, an acoustic surface wave resonator is employed in the place of the delay line used in the embodiment of FIG. 15. The acoustic surface wave resonator 33 is composed of a transducing element comprising a pair of interleaved comb type electrodes formed on the same substrate 1 as the filter unit 10. This acoustic surface wave resonator 33 has a phase characteristic which varies with the variation of the velocity of, acoustic waves on the substrate 10 so that it has the same function and effect as the delay line described above with respect to FIG. 15.

It is to be noted that these ancillary transducing elements, which constitute a delay line or an acoustic surface wave resonator, may be applicable to such acoustic surface wave filter devices as described above with respect to FIGS. 9, 12, 13 and 14.

It will be understood that it is not intended to limit the invention to the above example only, many variations, such as might readily occur to one skilled in the related art, being possible without departing from the scope thereof.

What is claimed is:

1. An acoustic surface wave filter device for use in video IF stages in television receivers and the like, which comprises a substrate of a piezoelectric material and a spaced pair of input and output transducers formed on said substrate, one of said transducers comprising a pair of interleaved-comb-type electrodes with a plurality of constant length and uniformly spaced electrode elements and having a frequency response curve wherein attenuation poles at the both sides of the main lobe thereof, respectively, occur at frequencies corresponding to the upper adjacent-channel picture IF carrier frequency and to the lower adjacent-channel sound IF carrier frequency, the other of said transducers comprising a pair of interleaved-comb-type electrodes and having a frequency response curve wherein the attenuation poles at the both sides of the main lobe, respectively, occur at a frequency higher than the lower adjacent-channel sound IF carrier frequency and at a frequency between the upper adjacent-channel picture IF carrier frequency and the sound If carrier frequency of the associated channel.

2. An acoustic surface wave filter device according to claim 1 wherein said other transducer comprises a pair of interleaved comb type electrodes with a plurality of constant length and uniformly spaced electrode elements.

3. An acoustic surface wave filter device according to claim 1 wherein said other transducer comprises a pair of interleaved length-weighted comb type electrodes with a plurality of varied-length electrode elements.

4. An acoustic surface wave filter device according to claim 1, further comprising a piezoelectric resonator and a pair of dampers, said piezoelectric resonator being formed on the same plane of the support as the filter unit and having a resonance or antiresonance frequency corresponding to the sound IF carrier frequency of the associated-channel, one of said dampers being positioned between the piezoelectric resonator and one fo the transducers adjacent to said resonator while the other of said dampers being positioned between the other transducer and one of the opposed ends of the substrate remote from said resonator.

5. An acoustic surface wave filter device according to claim 1, further comprising a piezoelectric resonator and two pairs of dampers, said piezoelectric resonator being formed by the provision of electrodes on the opposed surfaces of the substrate in alignment with each other and having a resonance or anti-resonance frequency corresponding to the sound IF carrier frequency of the associated-channel, the one pair of said dampers being positioned between said resonator and one of the transducers adjacent to said resonator while the other pair of said dampers being positioned between said resonator and one of the opposed ends of the substrate adjacent to said resonator.

* * * * *